US011963451B2

(12) United States Patent
Grosso et al.

(10) Patent No.: US 11,963,451 B2
(45) Date of Patent: Apr. 16, 2024

(54) SYSTEM AND METHOD FOR PASSIVE DAMPING OF MECHANICAL VIBRATIONS

(71) Applicant: PYTHEAS TECHNOLOGY, Meyreuil (FR)

(72) Inventors: Gilles Grosso, Six-Fours-les-Plages (FR); Frédéric Mosca, Chateau-Neuf-le-Rouge (FR)

(73) Assignee: PYTHEAS TECHNOLOGY, Meyreuil (FR)

( * ) Notice: Subject to any disclaimer, the term of this patent is extended or adjusted under 35 U.S.C. 154(b) by 425 days.

(21) Appl. No.: 16/972,213

(22) PCT Filed: Jun. 6, 2019

(86) PCT No.: PCT/FR2019/051368
§ 371 (c)(1),
(2) Date: Dec. 4, 2020

(87) PCT Pub. No.: WO2019/234366
PCT Pub. Date: Dec. 12, 2019

(65) Prior Publication Data
US 2021/0226116 A1  Jul. 22, 2021

(30) Foreign Application Priority Data
Jun. 6, 2018 (FR) ...................... 1854917

(51) Int. Cl.
*H02N 2/18* (2006.01)
*F16F 15/00* (2006.01)
(Continued)

(52) U.S. Cl.
CPC ........... *H10N 30/30* (2023.02); *F16F 15/007* (2013.01); *F16F 15/04* (2013.01); *H02N 2/181* (2013.01); *H10N 30/04* (2023.02)

(58) Field of Classification Search
CPC ............... H01L 41/113; H01L 41/1132; H01L 41/1134; H01L 41/1136; H01L 41/1138;
(Continued)

(56) References Cited

U.S. PATENT DOCUMENTS 5,783,898 A   7/1998 Wu
8,912,710 B2  12/2014 Rastegar
(Continued)

FOREIGN PATENT DOCUMENTS

JP   3 790255 B1   6/2006
WO  2017/048906 A1  3/2017
WO  2017/051133 A1  3/2017

OTHER PUBLICATIONS

International Search Report dated Sep. 12, 2019 in corresponding International application No. PCT/FR2019/051368; 7 pages.

*Primary Examiner* — Derek J Rosenau
(74) *Attorney, Agent, or Firm* — Maier & Maier, PLLC

(57) ABSTRACT

A system for passive damping of mechanical vibrations generated by a vibrating structure supported by a support, including a transducer interposed between the vibrating structure and the support to transform mechanical energy of vibrations into electrical energy. The transducer includes a flextensional structure having a first axis perpendicular to a second axis, a stack of piezoelectric elements adapted to produce electrical energy when stressed, the stack stressed in compression by the flextensional structure along the first axis so that deformation of the structure modifies the compressive stress applied to the stack, two peripheral fasteners are secured to the flextensional structure, each fastener disposed along the second axis, a first fastener for securing the flextensional structure to the vibrating structure, a second fastener for securing the flextensional structure to the support, at least one fastener integrates an elastic suspen-
(Continued)

sion, a shunt connected to the piezoelectric stack to dissipate electrical energy.

13 Claims, 7 Drawing Sheets

(51) Int. Cl.
*F16F 15/04* (2006.01)
*H01L 41/113* (2006.01)
*H10N 30/04* (2023.01)
*H10N 30/30* (2023.01)

(58) Field of Classification Search
CPC .... H10N 30/30; H10N 30/302; H10N 30/304; H10N 30/306; H10N 30/308; H02N 2/18; H02N 2/181; H02N 2/183; H02N 2/185; H02N 2/186; H02N 2/188
USPC .......................................................... 310/339
See application file for complete search history.

(56) References Cited

U.S. PATENT DOCUMENTS

| | | | |
|---|---|---|---|
| 2003/0016089 A1* | 1/2003 | Cousy | H02N 2/18 340/407.1 |
| 2003/0209953 A1* | 11/2003 | Park | F16F 15/005 310/317 |
| 2005/0134149 A1* | 6/2005 | Deng | H02N 2/186 310/339 |
| 2007/0164189 A1 | 7/2007 | Corsaro et al. | |

\* cited by examiner

SYSTEM AND METHOD FOR PASSIVE DAMPING OF MECHANICAL VIBRATIONS

FIELD

The object of the invention is a system and method for passive damping of mechanical vibrations.

It relates to the technical field of passive vibration isolators, that is to say which do not operate as actuators transforming electrical vibrations into mechanical vibrations acting in phase opposition with the vibrations to be attenuated.

BACKGROUND

Vibration isolators are generally mounted between, on one side, a structure that produces vibrations, and on the other side, a part potentially susceptible to receive these vibrations. They allow the vibrations of the vibrating structure to be absorbed and thus prevent them from being transmitted to the receiving part. For example, a vibration isolator can be interposed between the support part of a rotating machine and the rotating machine itself so that the vibrations generated by the rotating machine are not transmitted to the support part.

There are different types of vibration isolators based on different techniques. In particular, isolators with a fluid chamber and orifice or elastomer or metallic suspensions are known. These purely mechanical isolators transform the mechanical energy of vibrations into thermal energy (heat). These technologies are mature and proven but may have a number of limitations in terms of performance and adaptability to operating conditions (temperature, operating regime of the vibrating structure, transmission of a static force, . . . ).

Electromagnetic, magnetostrictive or piezoelectric suspensions are also known which use electroactive materials to convert the mechanical energy of vibrations into electrical energy. These technologies are efficient and allow better adaptability to the context of use. However, they are not widely used and are sometimes perceived as less robust than the purely mechanical isolators mentioned above. In addition, these solutions, when they are implemented in passive assemblies (the suspension not having an actuator role), do not allow efficient damping at low frequency due to the relative rigidity of the electro-active materials used.

FIG. 1 is a diagram illustrating the attenuation that can be achieved with a piezoelectric stack. The abscissas correspond to the vibration frequency in Hertz and the ordinates correspond to the transmissibility in decibels (ratio of the force transmitted to the excitation force). Up to about 100 Hz, it is noted that the transmissibility is zero, that is to say, the piezoelectric stack passes all vibrations, without producing any attenuation. A positive transmissibility peak of about 20 dB appears around 500 Hz, this rejection meaning that the piezoelectric stack amplifies the vibratory phenomenon rather than attenuating it. It is only from this peak of frequencies that the transmissibility becomes negative. The piezoelectric stack attenuates vibrations of about 40 dB/decade over a frequency range from about 500 Hz to about 20 KHz, this frequency range (Z) corresponding to noise pollution that it is particularly advantageous to attenuate.

From the documents WO2017/048906 (UNIV MICHIGAN) and JP 3790255 (TAIHEIYO CEMENT CORP), mechanical vibration damping systems comprising a transducer are known. This transducer is in the shape of a twin-blade operating only in flexion. In practice, the performances of this type of system are limited in terms of damping and attenuation of vibrations, especially in static resistance.

A mechanical vibration damping system comprising a cymbal-type transducer is also known from document US 2005/134149 (DENG KEN K). A piezoelectric element is radially compressed by the cymbals. Here again, the performances of this system are not optimal in terms of vibration damping and attenuation.

Faced with this state of affairs, a purpose of the invention is to provide a vibration isolator having improved performances compared to those of the vibration isolators of the aforementioned prior art.

Another purpose of the invention is to provide a vibration isolator which allows to optimize adaptability to operating conditions.

Yet another purpose of the invention is to provide a robust vibration isolator, the design of which is simple, robust and inexpensive.

An additional purpose of the invention is to provide a vibration isolator allowing an efficient damping of vibrations, over a wide frequency band, in particular at low frequencies and with increased attenuation over the frequency band from about 500 Hz to about 20 KHz.

SUMMARY

The solution proposed by the invention is a passive system for damping mechanical vibrations generated by a vibrating structure supported by a support, the system comprising:
  a transducer interposed between the vibrating structure and the support to transform the mechanical energy of the vibrations into electrical energy and including:
    a flextensional structure having a first axis and a second axis perpendicular to each other,
    piezoelectric elements stacked along the first axis so as to form a piezoelectric stack, which piezoelectric stack is adapted to produce electrical energy when it is stressed, which stack is stressed in compression by the flextensional structure along the first axis so that a deformation of said structure modifies the compressive stress applied to said stack,
  two peripheral fasteners are secured to the flextensional structure, each of the fasteners being disposed along the second axis,
    a first fastener for securing the flextensional structure to the vibrating structure,
    a second fastener for securing the flextensional structure to the support,
    at least one of the fasteners preferably integrates an elastic suspension,
  a means for modifying the electrical stiffness of the piezoelectric stack, which means is a shunt connected to said piezoelectric stack so as to dissipate all or part of the electrical energy produced by the stress applied to said piezoelectric stack.

This damping system, or vibration isolator, includes a piezoelectric transducer of flextensional type advantageously combined with an elastic suspension placed in series with said transducer. The applicant has found that this particularly robust vibration isolator had improved performances compared to those of the aforementioned prior art vibration isolators. In particular, it allows efficient damping of vibrations over a frequency range from about 50 Hz to 20 KHz, with an attenuation of 40 dB/decade to 60 dB/decade over the frequency band from about 500 Hz to about 20

KHz. The shunt can further be easily controlled to modify the stiffness of the piezoelectric stack depending on the operating conditions, thereby to further improve the vibration attenuation as well as generally improving the electromechanical coupling of the system.

Other advantageous features of the invention are listed below. Each of these features can be considered alone or in combination with the remarkable features defined above, and be the object, where applicable, of one or more divisional patent applications:

Advantageously, the elastic suspension is integrated into the fastener which is furthest from the vibrating structure.

The elastic suspension can be an elastomer suspension, or a metallic or pneumatic or hydraulic suspension.

The shunt can consist of an electrical resistance connected to the terminals of the piezoelectric stack so as to thermally dissipate all or part of the electrical energy produced by the stress applied to said piezoelectric stack.

According to an alternative embodiment, the shunt consists of an electrical resistance and an inductor connected to the terminals of the piezoelectric stack so as to form an RLC resonant electronic circuit tuned to a frequency band to be attenuated.

Advantageously, an electronic management unit is connected to an accelerometer placed so as to sense the vibrations of the support and/or to an accelerometer placed so as to sense the vibrations of the vibrating structure, which electronic management unit drives the shunt to modify the electrical stiffness of said piezoelectric stack depending on the signals emitted by the accelerometer.

Advantageously, a portion of the electrical energy produced by the stress applied to the piezoelectric stack, and which is not dissipated by the shunt, powers one or more electronic components.

Advantageously, the flextensional structure has:—two opposite side end pieces, disposed perpendicular to the first axis and symmetrically on either side of the second axis;—two opposite transverse flanges, disposed perpendicular to the second axis and symmetrically on either side of the first axis;—identical longitudinal arms which extend along the first axis and which connect the side end pieces to the transverse flanges.

The connections between, on the one hand, the longitudinal arms, and on the other hand, the side end pieces and the transverse flanges, advantageously consist of articulations, which articulations are formed by thinner areas forming a hinge arranged at the ends of each arm.

Advantageously, an elastomer pad is interposed between the transverse flanges so as to limit the movement of the flextensional structure along the second axis.

Advantageously, the piezoelectric stack is pre-stressed, the pre-stressing force applied to said stack being produced:—by the cooperation of a rod installed along the first axis and on which the piezoelectric stack is mounted, with screw elements installed in the flextensional structure;—or directly by the flextensional structure.

Another aspect of the invention relates to a method for damping mechanical vibrations of a wiper motor of a motor vehicle, which motor is supported by a support, said method consisting in using the damping system according to one of the preceding features, by interposing the transducer between said wiper motor and said support.

Yet another aspect of the invention relates to a method for damping mechanical vibrations generated by a vibrating structure supported by a support (3), said method comprising the steps of:

using the damping system according to one of the preceding features, by interposing the transducer between said vibrating structure and said support, modifying the electrical stiffness of the piezoelectric stack by means of the shunt, depending on the frequency band to be attenuated.

Still another aspect of the invention relates to a method for damping mechanical vibrations over a frequency band from 50 Hz±10 HZ to 20 KHz±100 HZ, which vibrations are generated by a vibrating structure supported by a support, said method consisting in using the damping system according to one of the preceding features, by interposing the transducer between said vibrating structure and said support.

Yet another aspect of the invention relates to a method for damping mechanical vibrations, with an attenuation of 40 dB/decade±10 dB/decade to 60 dB/decade±10 dB/decade, over a frequency band ranging from 500 Hz±100 HZ to 20 KHz±100 HZ, which vibrations are generated by a vibrating structure supported by a support, said method consisting in using the damping system according to one of the preceding features, by interposing the transducer between said vibrating structure and said support.

BRIEF DESCRIPTION OF THE FIGURES

Other advantages and features of the invention will become more apparent upon reading the description of a preferred embodiment which follows, with reference to the appended drawings, made as indicative and non-limiting examples and on which.

DETAILED DESCRIPTION OF THE EMBODIMENTS

The terms right/left, upper/lower, top/bottom, horizontal/vertical that may be used in this description essentially refer to the position of the elements illustrated in the appended drawings. They are used only as indicative and non-limiting examples.

Figure 5:
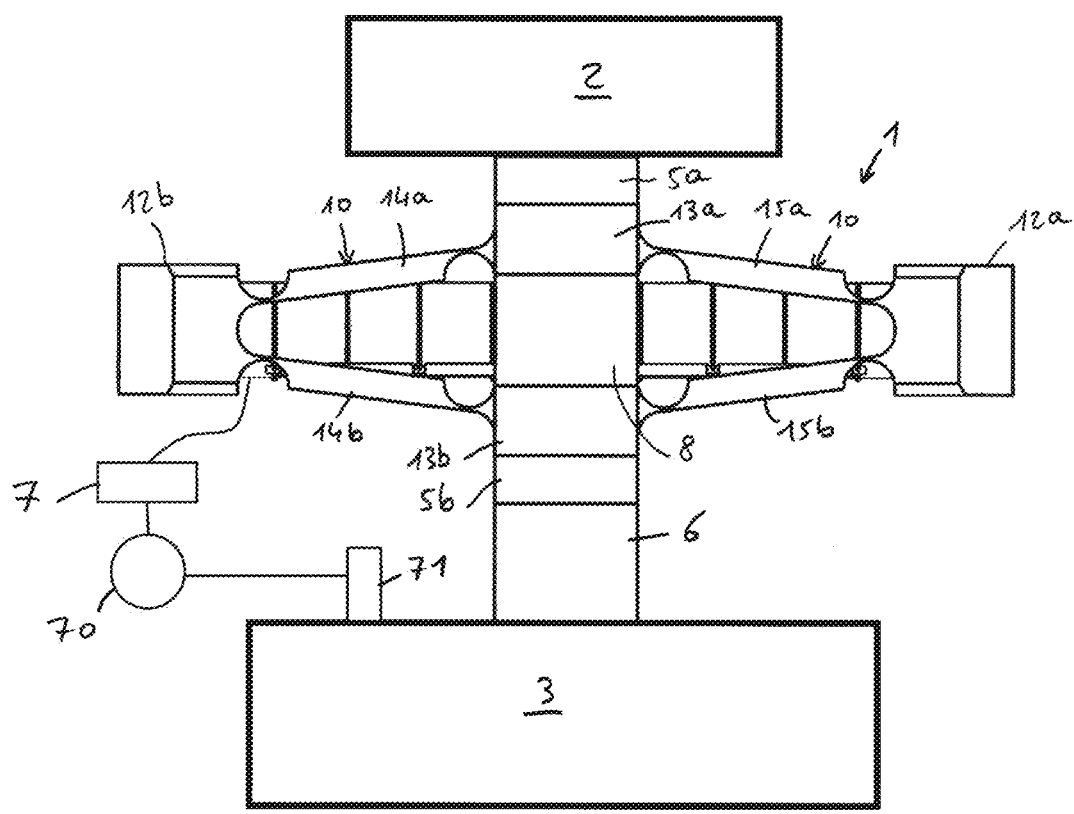
FIG. 5 illustrates the transducer of FIGS. 2 to 4a-4b interposed between a vibrating structure and a support, the piezoelectric stack being connected to a shunt.

In FIG. 5, the damping system object of the invention includes a transducer 1 interposed between a vibrating structure 2 and a support 3 supporting said vibrating structure. This vibrating structure 2 is for example a rotating machine or a wiper motor of a motor vehicle. In the latter case, the support 3 may correspond to the linkage which supports the wiper or to a chassis element of the vehicle.

The function of the transducer 1 is to transform the mechanical energy of the vibrations generated by the vibrating structure 2 into electrical energy, so that these vibrations are not or little transmitted to the support 3.

With reference to FIGS. 2 to 5, the transducer 1 includes a flextensional structure 10. The term "flextensional structure" means a structure in combined flexion and tension. This mechanical structure is deformable and forms a mechanical amplifier, transmitting and amplifying the vibratory forces of the vibrating structure 2 to a piezoelectric stack 4.

The structure 10 has a first axis A-A and a second axis B-B perpendicular to each other. In the appended figures, the axis A-A is a horizontal longitudinal axis and the axis B-B is a vertical transverse axis. The structure 10 has a general octagonal shape, which is elongated along the first axis A-A. It can be inscribed in an envelope whose length is comprised between 5 cm and 30 cm, width is comprised between 2 cm and 10 cm and height is comprised between 2 cm and 10 cm.

The structure 10 preferably has:
two opposite short sides or lateral end pieces 12a, 12b which are identical (or not), disposed perpendicular to the first axis A-A and symmetrically on either side of the second axis B-B; these end pieces have a general parallelepipedal or cylindrical shape,
two opposite small transverse flanges 13a, 13b which are identical (or not), disposed perpendicular to the second axis B-B and symmetrically on either side of the first axis A-A; these flanges have a general parallelepipedal or cylindrical shape;
identical longitudinal arms 14a, 14b, 15a, 15b which extend along the first axis A-A and which connect the end pieces 12a, 12b to the transverse flanges 13a, 13b; these arms may be of square, rectangular, round, oval section, etc.

More particularly, the structure 10 has:
a pair of upper arms 14a which connect the upper flange 13a to an upper edge of the left side end piece 12b,
a pair of lower arms 14b which connect the upper flange 13a to a lower edge of the left side end piece 12b,
a pair of upper arms 15a which connect the upper flange 13a to an upper edge of the right side end piece 12a,
a pair of lower arms 15b which connect the upper flange 13a to a lower edge of the right side end piece 12a.

In an alternative embodiment not shown, each pair of arms 14a, 14b, 15a, 15b is replaced by a single arm. However, the use of pairs of arms allows to better distribute the mechanical stresses in said arms. In another alternative embodiment not shown, each pair of arms 14a, 14b, 15a, 15b is replaced by a combination of three or more arms.

The end pieces 12a, 12b, flanges 13a, 13b and arms 14a, 14b, 15a, 15b preferably form a rigid single piece made of steel, stainless steel, aluminum or composite and obtained by machining or injection. These elements may, however, be in the shape of separate parts assembled together for example by welding, screwing or bolting.

The connections between the arms 14a, 14b, 15a, 15b, on the one hand, and the end pieces 12a, 12b and the flanges 13a, 13b, on the other hand, advantageously consist of articulations. To simplify the design of the structure 10, these articulations consist of thinner areas 140, 150 forming a hinge which are arranged at the ends of each arm 14a, 14b, 15a, 15b. Thus, the number of mechanical parts is limited, which offers significantly improved maintenance of the transducer.

The mechanical structure 10 is thus elastically deformable. When it is subjected to a compressive stress (bending) along the axis B-B, the flanges 13a, 13b tend to move closer to each other. This approaching of the flanges 13a, 13b increases the distance separating the end pieces 12a, 12b. Conversely, when the compressive stress along the axis B-B is reversed (extension), the flanges 13a, 13b move away from each other, and the distance between the end pieces 12a, 12b decreases. It is understood that these compressive stresses are generated by the vibrations of the vibrating structure 2.

To limit the movement of the structure 10 along the axis B-B, an elastomer pad 8 can be provided interposed between the two flanges 13a, 13b. This pad 8 prevents an excessive displacement of the structure 10 liable to damage it.

A stack 4 of piezoelectric elements is installed in the structure 10. It is adapted to produce electrical energy when it is stressed. The piezoelectric elements of the stack 4 are advantageously in the shape of piezoceramic or piezocomposite washers or discs adapted to be electrically polarized under the action of a mechanical stress. The number of washers can vary from 3 to 20 depending on the length of the structure 10. For example, 8 hard ceramic LZT (Lead Zirconate Titanate) washers are used, the stack 4 having a stiffness of 16 MN/m and a Young's modulus of about 50 GPa. This stack 4 is capable of delivering a voltage of 73 volts under a force of 100 Newtons.

In FIGS. 2 to 5, the stack 4 is installed along the first axis A-A, between the end pieces 12a, 12b, so that a deformation of the structure 10 modifies the compressive stress applied to said stack. More particularly, and as explained in the previous paragraph, when the vibrating structure 2 vibrates, the structure 10 is deformed along the axis B-B, by a pinching effect, a compressive stress is applied to the stack 4. The structure 10 thus acts as a mechanical amplifier, transmitting and amplifying the vibratory forces from the vibrating structure 2 to the stack 4.

Figure 4A:
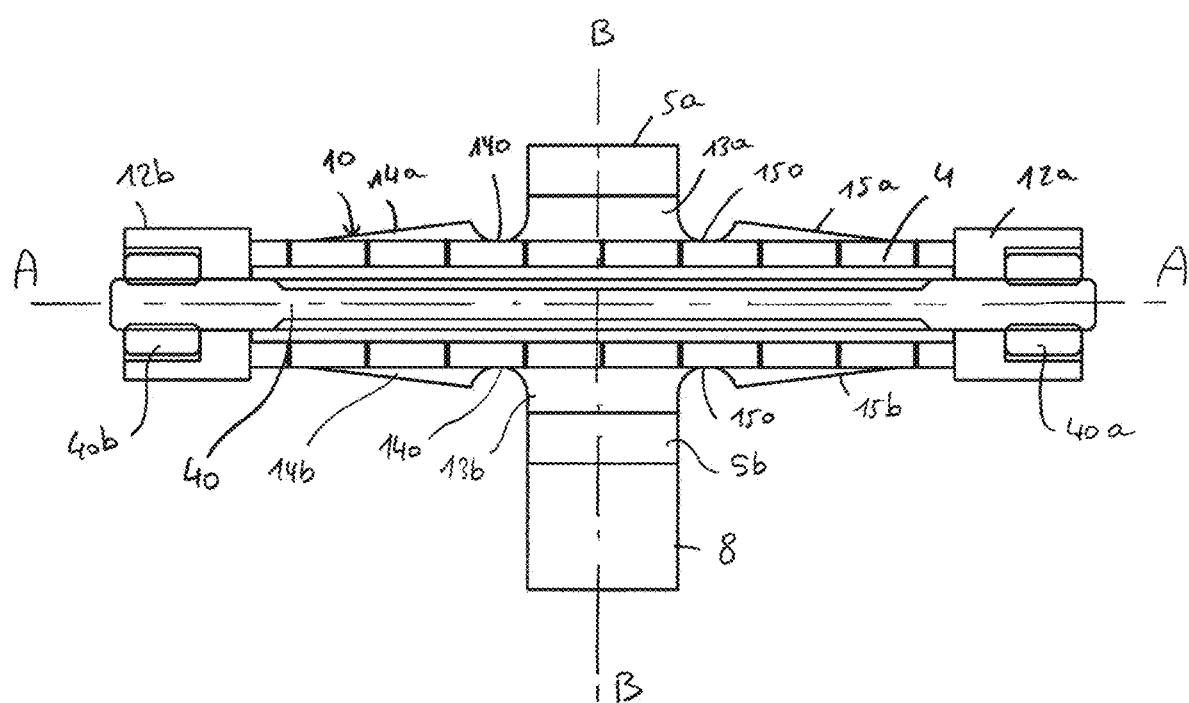
FIG. 4a is a sectional view along A-A of the transducer of FIG. 3.

The stack 4 is advantageously pre-stressed to improve the mechanical tensile strength of the transducer 1. In FIG. 4a, the stack 4 is mounted on a rod 40 installed along the first axis A-A. Screw elements 40a, 40b, installed in the end pieces 12a, 12b, are engaged with the threaded ends of the rod 40. The cooperation of the screw elements 40a, 40b with the rod 40 allows a pre-stress to be applied to the stack 4.

Figure 4B:
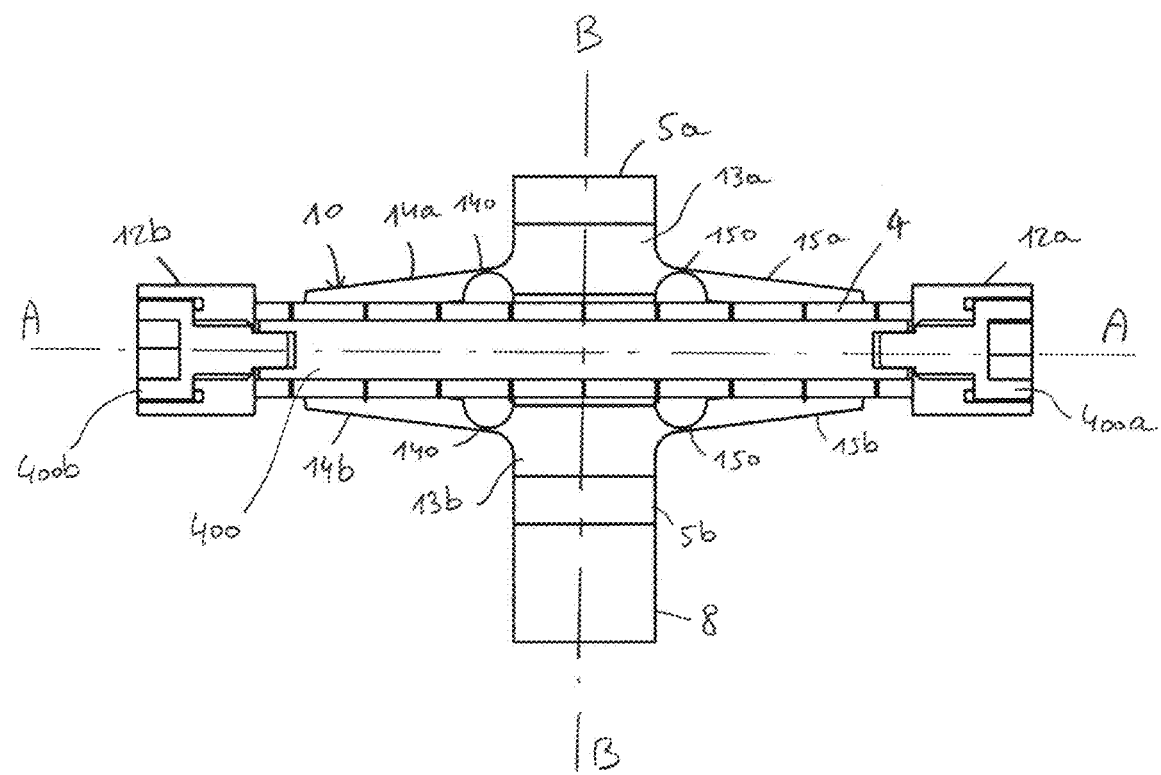
FIG. 4b is a sectional view along A-A of the transducer of FIG. 3, according to an alternative embodiment.

In FIG. 4b, it is the structure 10 which directly produces the pre-stressing force applied to the stack 4. The structure 10 is elastically deformed to allow placing the stack 4. In practice, a compressive stress along the axis B-B is applied to the flanges 13a, 13b so that the end pieces 12a, 12b move away from each other so as to allow the insertion of the stack 4. By releasing the flanges 13a, 13b, the end pieces 12a, 12b move closer to each other and compress the stack 4 which is thus pre-stressed. To facilitate the insertion of the stack 4, the latter is mounted on a guide rod 400 held in position along the axis A-A by screw elements 400a, 400b installed in the end pieces 12a, 12b.

Mounting the transducer 1 is carried out very simply and very quickly as follows: the rod 40 is inserted into the stack 4; the stack 4 is installed in the structure 10, between the end pieces 12a, 12b; the screw elements 40a, 40b are positioned in the end pieces 12a, 12b so that said elements are engaged with the threaded ends of the rod 40; the screw elements 40a, 40b are screwed with a dedicated tool (for example: torque wrench) so as to pre-stress the stack 4 according to a desired pre-stressing force. To facilitate the installation of the stack 4 inside the structure 10, the upper flange 13a and/or the lower flange 13b can be made in two portions so as to leave a passage openwork.

Two peripheral fasteners 5a, 5b are secured to the structure 10. The upper fastener 5a is secured to the upper flange 13a and the lower fastener 5b to the lower flange 13b. The fasteners 5a, 5b are thus disposed along the second axis B, B. The securing of the fasteners 5a, 5b on the flanges 13a, 13b can for example be obtained by welding, screwing or bolting. The shape of the fasteners 5a, 5b is complementary to that of the flanges 13a, 13b. In FIGS. 2 to 5, the fasteners 5a, 5b are in the shape of parallelepipedal and rigid flat clamps, made of steel, stainless steel, aluminum or composite, obtained for example by machining Their length and width dimensions correspond to those of the flanges 13a, 13b. Their thickness can vary from 1 cm to 10 cm.

In FIG. 5, the upper fastener 5a is used to secure the structure 10 to the vibrating structure 2, by screwing or bolting. And the lower fastener 5b is used to secure the structure 10, also by screwing or bolting.

According to an advantageous feature of the invention, at least one of the fasteners 5a and/or 5b integrates an elastic suspension. "Integrate" means that the fastener 5b and the suspension 6 may be two distinct parts assembled together or, on the contrary, formed in one single part.

In FIGS. 2 to 5, it is the lower fastener 5b which integrates this suspension 6. The latter acts as an interface between the lower fastener 5b and the support 3. The lower fastener 5b can be constituted by this single suspension 6. However, the suspension 6 can be integrated only into the upper fastener 5a, between the vibrating structure 2 and said fastener. The two fasteners 5a and 5b could also each integrate an elastic suspension. The best results in terms of damping are however obtained when the elastic suspension is integrated into the fastener 5b which is furthest from the vibrating structure 2.

To simplify the design, improve the robustness and dispense with complex and expensive solutions, this suspension 6 is preferably in the shape of an elastomer flange, for example made of natural or synthetic rubber, the shape of which is complementary to that of the fastener 5b. In FIGS. 2 to 5, it is in the shape of a parallelepiped flange, the length and width dimensions of which correspond to those of the lower fastener 5b. Its thickness can vary from 1 cm to 10 cm. For example, a natural rubber flange having a stiffness of 250 kN/m and a Young's modulus of about 1.5 MPa is used. In practice, the stiffness of the suspension 6 is selected depending on the frequency band of the vibrations to be attenuated. The assembly of the elastomer flange 6 on the flange 5b is done by gluing, screwing or bolting.

The suspension 6 can also be in the shape of one or more elastomer pads assembled between the lower fastener 5b and the support 3. The suspension 6 can also be in the shape of a metal suspension, for example a helical or leaf spring, or a pneumatic or hydraulic suspension.

Referring to FIG. 5, a shunt 7 is connected to the piezoelectric stack 4. This shunt 7 is used to modify the electrical stiffness of the stack 4 and more generally to improve the electromechanical coupling of the system. The electromechanical coupling reflects the efficiency of the system in converting mechanical energy into electrical energy and vice versa. It is characterized by an electromechanical coupling coefficient (EMCC) which can be defined by the ratio below:

$$EMCC = \frac{\text{Electrical energy}}{\text{Electrical energy} + \text{Mechanical energy}}$$

where the electrical energy is that produced by the stack 4 and the mechanical energy is that applied to the flextensional structure 10.

The shunt 7 allows in particular to dissipate all or part of the electrical energy produced by the stress applied to the stack 4 during the deformation of the structure 10. The stack 4 produces an electrical signal transmitted to the shunt 7. Upon reception of the signal, the shunt 7 provides resistance to the electrical signal. As a result of this resistance, the stack 4 resists the deformation of the structure 10, so that its electrical stiffness is modified. The stack 4 then acts as a damper.

The electrical stiffness of the stack 4 (and more generally the electromechanical coupling coefficient of the system) can thus be modified depending on the frequency band to be attenuated. The inventors have observed that the electromechanical coupling of the system was improved with the shunt 7 (the EMCC coefficient of the system with shunt is greater than the EMCC coefficient of an equivalent system without shunt).

The shunt 7 can consist of an electrical resistance connected in parallel or in series to the terminals of the stack 4, thermally dissipating (that is to say in the form of heat) all or part of the electrical energy. Knowing that the piezoelectric stack 4 is equivalent to an electric capacitor, an RC electronic circuit is obtained allowing to produce a low-pass or high-pass filter tuned to the frequency band to be attenuated.

The shunt 7 can also consist of an electrical resistance and an inductor (coil) connected to the terminals of the stack 4 so as to form an RLC resonant electronic circuit, parallel or series, tuned to the frequency band to be attenuated. This type of (resistive or resistive-inductive) shunt 7 is passive, stable, simple and compact.

In an alternative embodiment, a shunt 7 with negative capacitance is used which further improves the electromechanical coupling of the system. This shunt 7 includes a resistor and a synthetic negative capacitor having a real and imaginary impedance tuned to the frequency band to be attenuated. The electrical impedance of the negative capacitor modifies the stiffness of the piezoelectric stack 4 to increase damping and to optimize the electromechanical coupling of the system.

In FIG. 5, an electronic management unit 70 is connected to an accelerometer 71 placed so as to sense the vibrations of the support 3 and/or to an accelerometer placed so as to sense the vibrations of the vibrating structure 2. The management unit 70 is then adapted to drive the shunt 7 so as to modify the electrical stiffness of the stack 4 depending on the signals emitted by the accelerometer 71. For example, the shunt 7 can integrate a variable resistor or a variable impedance whose value is modified by the management unit 70 depending on the signals emitted by the accelerometer 71.

A portion of the electrical energy produced by the stress applied to the piezoelectric stack 4, and which is not dissipated by the shunt 7, can be used to power one or more electronic components. This electrical energy can for example be used to power the management unit 70 and/or the accelerometer 71.

Figure 1:
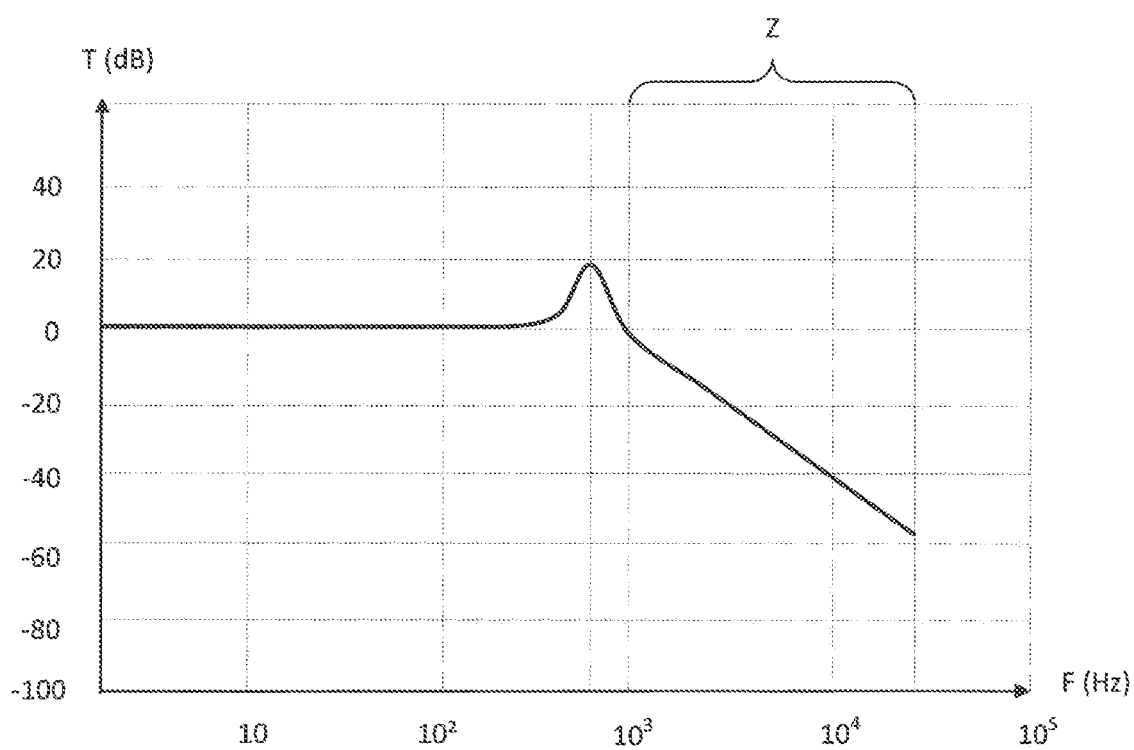
FIG. 1 above is a diagram illustrating the attenuation that can be obtained with a piezoelectric stack.
Figure 2:
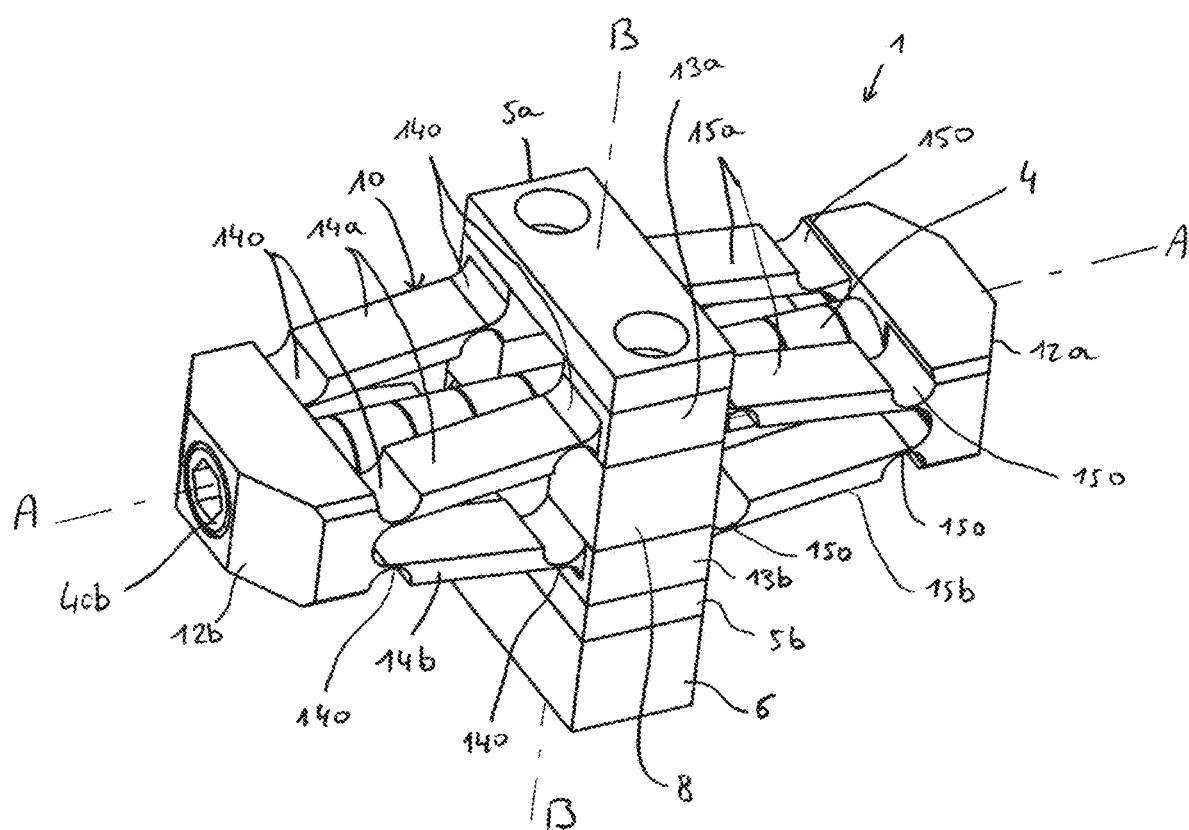
FIG. 2 is a perspective view of a transducer in accordance with the invention showing a flextensional structure.
Figure 3:
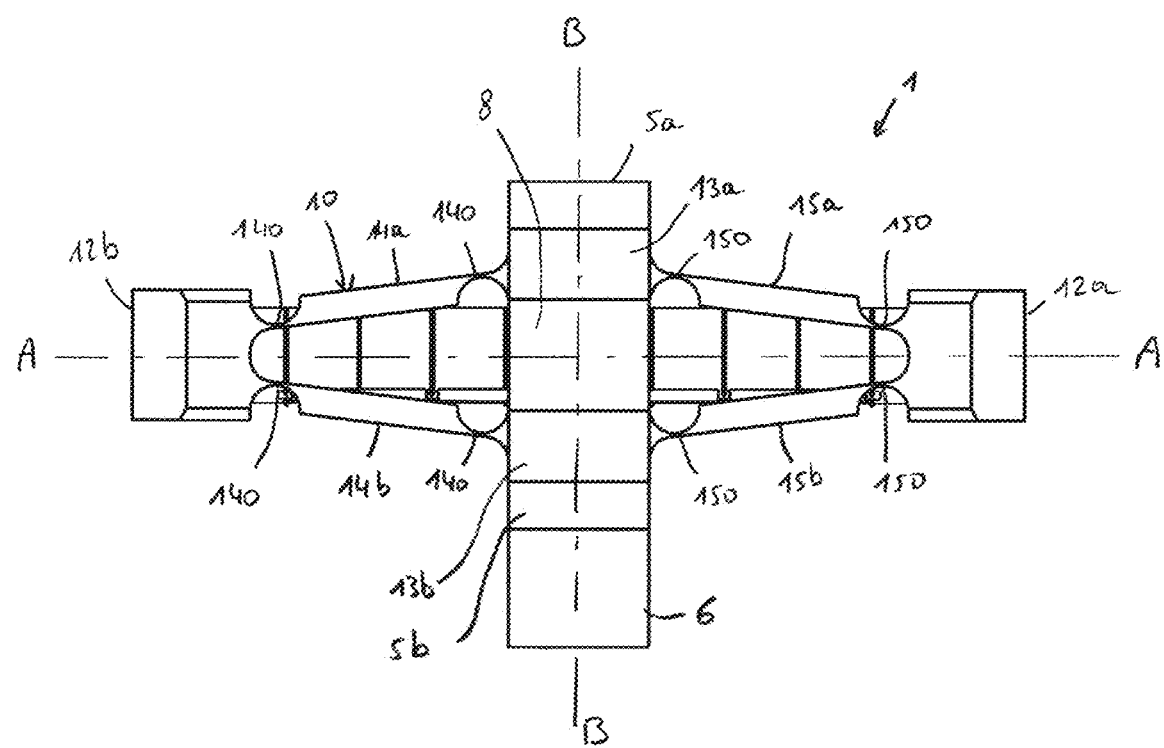
FIG. 3 is a side view of the transducer of FIG. 2.
Figure 6:
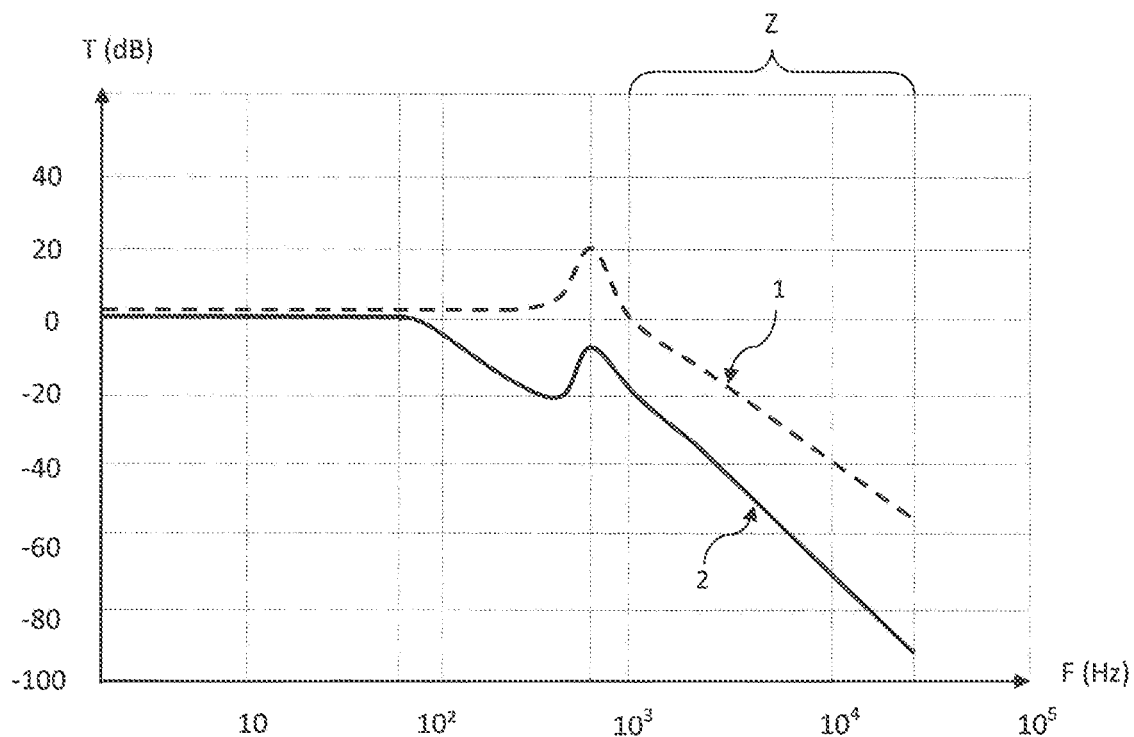
FIG. 6 is a diagram illustrating the attenuation obtainable with a damping system in accordance with the invention.

FIG. 6 is a diagram illustrating the attenuation obtainable with a damping system in accordance with the invention. The abscissas correspond to the frequency in Hertz of the vibrations and the ordinates correspond to the transmissibility in decibels. Curve 1 in dotted lines uses the attenuation curve in FIG. 1 (piezoelectric stack only). Curve 2 in solid lines is the attenuation curve obtained with the piezoelectric stack 4 combined with the elastic suspension. Up to about 50 Hz (±10 Hz), the transmissibility remains almost zero. Compared to curve 1, the system according to the invention allows the inflection point of the attenuation curve to be moved back by approximately 50 dB±10 HZ. From this frequency area, the transmissibility becomes negative, with an attenuation of 40 dB/decade (±10 dB/decade) up to a frequency of 500 Hz (±100 HZ). Around this frequency, a transmissibility peak of around 20 dB occurs, with less vibration attenuation. The adjustment of the shunt 7 (for example the value of the resistance, the inductance or the negative capacitance) however allows to process and attenuate this rejection. From this peak, the attenuation is 40 dB/decade±10 dB/decade to 60 dB/decade±10 dB/decade over the frequency range z from 500 Hz±100 HZ to 20 KHz±100 HZ. In summary, the system according to the invention allows vibration damping over a frequency range (50 Hz-20 KHz) wider than that obtained by a piezoelectric stack alone (100 Hz-20 KHz). Furthermore, the attenuation of noise pollution is better (greater than 40 dB/decade).

The arrangement of the various elements and/or means and/or steps of the invention, in the embodiments described above, should not be understood as requiring such an arrangement in all implementations. In any event, it will be understood that various modifications can be made to these elements and/or means and/or steps, without departing from the spirit and scope of the invention.

The invention claimed is:

1. A system for passive damping of mechanical vibrations generated by a vibrating structure supported by a support, the system comprising a transducer interposed between the vibrating structure and the support to transform the mechanical energy of the vibrations into electrical energy,
wherein:
   the transducer includes:
      a flextensional structure having a first axis and a second axis perpendicular to each other,
      piezoelectric elements stacked along the first axis so as to form a piezoelectric stack, the piezoelectric stack is adapted to produce electrical energy when it is stressed, and the stack is stressed in compression by the flextensional structure along the first axis so that a deformation of said structure modifies the compressive stress applied to said stack,
   two peripheral fasteners are secured to the flextensional structure, each of the fasteners being disposed along the second axis,
   a first fastener for securing the flextensional structure to the vibrating structure,
   a second fastener for securing the flextensional structure to the support,
   at least one of the fasteners integrates an elastic suspension,
   said system further includes a means for modifying the electrical stiffness of the piezoelectric stack depending on a frequency band to be attenuated, the means comprising a shunt connected to said piezoelectric stack so as to dissipate all or part of the electrical energy produced by the stress applied to said piezoelectric stack;
   wherein the elastic suspension is an elastomer suspension, a metallic suspension, a pneumatic suspension, or a hydraulic suspension.

2. The system according to claim 1, wherein the elastic suspension is integrated into the fastener which is furthest from the vibrating structure.

3. The system according to claim 1, wherein the shunt comprises an electrical resistance connected to the terminals of the piezoelectric stack so as to thermally dissipate all or part of the electrical energy produced by the stress applied to said piezoelectric stack.

4. The system according to claim 1, wherein the shunt comprises an electrical resistance and an inductor connected to the terminals of the piezoelectric stack so as to form an RLC resonant electronic circuit tuned to a frequency band to be attenuated.

5. The system according to claim 1, wherein an electronic management unit is connected to an accelerometer placed so as to sense the vibrations of the support and/or to an accelerometer placed so as to sense the vibrations of the vibrating structure, which electronic management unit drives the shunt to modify the electrical stiffness of said piezoelectric stack depending on the signals emitted by the accelerometer.

6. The system according to claim 1, wherein a portion of the electrical energy produced by the stress applied to the piezoelectric stack, and which is not dissipated by the shunt, powers one or more electronic components.

7. The system according to claim 1, wherein the flextensional structure has:
   two opposite side end pieces, disposed perpendicular to the first axis and symmetrically on either side of the second axis,
   two opposite transverse flanges, disposed perpendicular to the second axis and symmetrically on either side of the first axis; and
   identical longitudinal arms which extend along the first axis and which connect the side end pieces to the transverse flanges.

8. The system according to claim 7, wherein the connections between, on one hand, the longitudinal arms, and on another hand, the side end pieces and the transverse flanges, comprises articulations, and the articulations are formed by thinner areas forming a hinge arranged at the ends of each arm.

9. The system according to claim 7, wherein an elastomer pad is interposed between the transverse flanges so as to limit the movement of the flextensional structure along the second axis.

10. The system according to claim 7, wherein the piezoelectric stack is pre-stressed, and a pre-stressing force applied to said stack being produced:
   by the cooperation of a rod installed along the first axis and on which the piezoelectric stack is mounted, with screw elements installed in the flextensional structure, or
   directly by the flextensional structure.

11. A method for damping mechanical vibrations generated by a vibrating structure supported by a support, said method comprising the steps of:
   using the damping system according to claim 1 by interposing the transducer between said vibrating structure and said support,
   modifying the electrical stiffness of the piezoelectric stack by means of the shunt, depending on the frequency band to be attenuated.

12. A method for damping mechanical vibrations over a frequency band from 50 Hz to 20 KHz, which vibrations are generated by a vibrating structure supported by a support, said method comprising using the damping system according to claim 1 by interposing the transducer between said vibrating structure and said support.

13. A method for damping mechanical vibrations, with an attenuation of 40 dB/decade to 60 dB/decade, over a frequency band ranging from 500 Hz to 20 KHz, which vibrations are generated by a vibrating structure supported by a support, said method comprising using the damping system according to claim 1 by interposing the transducer between said vibrating structure and said support.

* * * * *